(12) United States Patent
Jeong

(10) Patent No.: US 8,787,106 B2
(45) Date of Patent: Jul. 22, 2014

(54) DATA STORING CIRCUIT AND REPAIR CIRCUIT OF MEMORY DEVICE INCLUDING THE SAME

(75) Inventor: Jeongsu Jeong, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 96 days.

(21) Appl. No.: 13/542,884

(22) Filed: Jul. 6, 2012

(65) Prior Publication Data

US 2014/0010024 A1    Jan. 9, 2014

(51) Int. Cl.
*G11C 7/00*    (2006.01)

(52) U.S. Cl.
USPC .............. 365/225.7; 365/189.05; 365/189.07

(58) Field of Classification Search
USPC ............ 365/225.7, 189.05, 189.07, 200, 201
See application file for complete search history.

(56) References Cited

U.S. PATENT DOCUMENTS

| | | | |
|---|---|---|---|
| 6,072,737 A * | 6/2000 | Morgan et al. ................ 365/201 |
| 6,430,101 B1 * | 8/2002 | Toda .......................... 365/225.7 |
| 6,667,902 B2 | 12/2003 | Peng |
| 6,777,757 B2 | 8/2004 | Peng et al. |
| 6,904,751 B2 | 6/2005 | Makki et al. |
| 7,173,851 B1 | 2/2007 | Callahan et al. |
| 7,269,047 B1 | 9/2007 | Fong et al. |
| 7,885,111 B2 * | 2/2011 | Chae et al. .............. 365/185.09 |

* cited by examiner

*Primary Examiner* — David Lam
(74) *Attorney, Agent, or Firm* — IP & T Group LLP

(57) ABSTRACT

A data storing circuit includes: a storage unit configured to store a multi-bit data and a validity signal representing validity of the data; and a decision unit configured to determine validity of the multi-bit data by comparing one-bit data of the multi-bit data with the validity signal.

13 Claims, 4 Drawing Sheets

DATA STORING CIRCUIT AND REPAIR CIRCUIT OF MEMORY DEVICE INCLUDING THE SAME

BACKGROUND

1. Field

Exemplary embodiments of the present invention relate to a data storing circuit, and more particularly, to a data storing circuit including a one-time program cell, such as a laser fuse or an e-fuse.

2. Description of the Related Art

A laser fuse outputs a signal, or data, whose logic value becomes different according to whether the fuse is cut or not, and an e-fuse outputs a signal whose logic value becomes different according to whether its gate oxide is ruptured or not. The laser fuse and the e-fuse are being used for different semiconductor devices such as a memory device.

Generally, a memory device uses a redundancy scheme, which uses a redundancy cell and improves production yield by substituting a defective cell with the redundancy cell. When a wafer process is ended and a defective cell is detected during a test process, the detected defective cell is to be substituted with a redundancy cell. To substitute the defective cell with a redundancy cell, the address of the detected defective cell is to be stored. Generally, a laser fuse or an e-fuse is used to store the address of the defective cell. However, the laser fuse or the e-fuse has a feature that once they are programmed (that is, once the logic value of data is changed), it is difficult to change the logic value of the data. For example, it is difficult to recover the laser fuse once the laser fuse is cut, and it is difficult to recover the e-fuse once the e-fuse is ruptured. For this reason, a memory cell formed of a laser fuse or an e-fuse is referred to as a one-time program cell.

FIG. 1 illustrates information stored in a data storing circuit that is formed of a one-time program cell.

Referring to FIG. 1, the data storing circuit 100 includes storages 111 to 117 for storing a 7-bit data and a storage 121 for storing validity of the data. Each of the storages 111 to 117 is formed of "a one-time program cell" (that is, a cell whose data logic value may be changed only once) such as a laser fuse or an e-fuse.

The 7-bit data stored in the storages 111 to 117 is data that the data storing circuit 100 stores, and the signal stored in the storage 121 signifies the validity of the data stored in the storages 111 to 117. For example, when the signal stored in the storage 121 has a value of '1', the data stored in the storages 111 to 117 is determined to be a valid data, and when the signal that is stored in the storage 121 has a value of '0', the data stored in the storages 111 to 117 is determined to be an invalid data.

The data logic value of a one-time program cell may be changed only once from the initial value. For instance, when the initial value is '0', the data logic value of the one-time program cell may be changed once to '1', and when the initial value is '1', the data logic value of the one-time program cell may be changed once to '0'. Hereafter, for illustration purposes, it is assumed that the initial value of the one-time program cell is '0'.

It is also assumed that the data storing circuit 100 stores data as shown in the following Table 1.

TABLE 1

| EN | D6 | D5 | D4 | D3 | D2 | D1 | D0 |
|----|----|----|----|----|----|----|----|
| 1  | 1  | 0  | 1  | 1  | 1  | 0  | 0  |

According to Table 1, the data stored in the data storing circuit 100 is '1011100'; the stored data is a valid data as indicated by "1" is stored in the storage 121) and may be used for further processing. If it is decided that the stored data is erroneous after the data of '1011100' is stored in the data storing circuit 100, the data stored in 'EN' is to be changed to '0' to prevent the data stored in the data storing circuit 100 from being used. However, since the storage 121 is formed of a one-time program cell, it is difficult to change the data stored in the storage 121 back to '0'.

SUMMARY

An embodiment of the present invention is directed to a method that may effectively determine a valid program in a data storing circuit using, for example, a one-time program cell.

In accordance with an embodiment of the present invention, a data storing circuit includes: a storage unit configured to store a multi-bit data and a validity signal representing validity of the data; and a decision unit configured to determine validity of the multi-bit data by comparing one-bit data of the multi-bit data with the validity signal.

In accordance with another embodiment of the present invention, a repair circuit of a memory device includes: a storage unit configured to store a multi-bit repair address and a validity signal representing validity of the repair address; a decision unit configured to determine validity of the repair address by comparing one-bit data of the multi-bit repair address with the validity signal and generate a validity determination signal in response to the comparison; a latch unit configured to store the validity determination signal and the repair address; and an address comparison unit configured to generate, when the validity determination signal is enabled, a repair signal by comparing an input address and the repair address stored in the latch unit.

In accordance with yet another embodiment of the present invention, an integrated circuit chip includes: an e-fuse array configured to store a plurality of data sets, each of which includes a multi-bit data, and validity signals that correspond to the data sets, respectively, and output a data set of the data sets and the corresponding validity signal at each cycle of a clock; a decision unit configured to generate validity determination signals, wherein the validity determination signals are each generated by comparing a respective one of the validity signals with one-bit data of the data set corresponding to the validity signal; a bus configured to transfer the validity determination signals and the data sets corresponding to the validity determination signals; a selection signal generation unit configured to generate a plurality of selection signals in response to the clock; and a plurality of latch sets configured to each store, in response to an enabled one of the selection signals, one of the validity determination signals and the data set corresponding to the validity determination signal.

DETAILED DESCRIPTION

Figure 1:
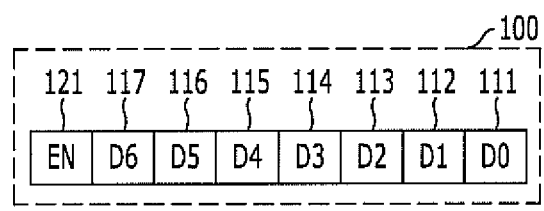
FIG. 1 illustrates information stored in a data storing circuit that is formed of a one-time program cell.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
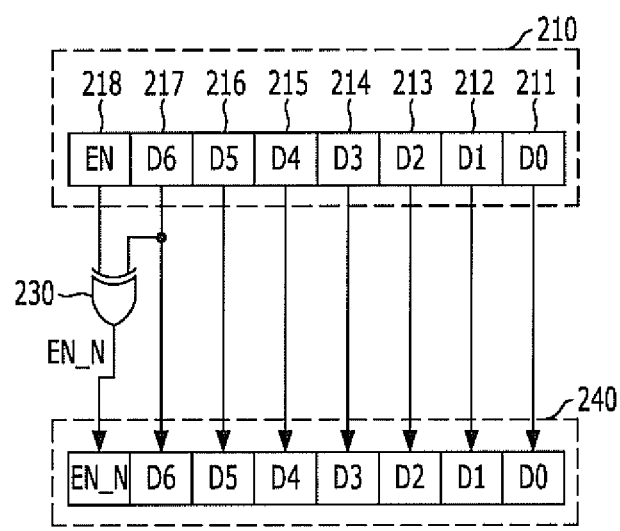
FIG. 2 is a block view illustrating a data storing circuit in accordance with an embodiment of the present invention.

FIG. 2 is a block view illustrating a data storing circuit in accordance with an embodiment of the present invention.

Referring to FIG. 2, the data storing circuit includes a storage unit 210, a decision unit 230, and a latch unit 240.

The storage unit 210 includes storages 211 to 217 for storing a 7-bit data D0 to D6 and a storage 218 for storing a valid signal EN which represents validity of the data D0 to D6. The storages 211 to 218 may be formed of any reasonably suitable memory cells, such as laser fuses and e-fuses and may be formed of one-time program cells. Although FIG. 2 illustrates a case where the storage unit 210 stores the 7-bit data D0 to D6, the number of bits of a data stored in the storage unit 210 may be changed according to different design needs.

The decision unit 230 determines validity by comparing the valid data EN with data D6 of a particular bit among the data D0 to D6 of multiple bits. The decision unit 230 determines validity of the multi-bit data based on whether the logic value of the data D6 of the particular bit is the same as the valid data EN. When the logic value of the data D6 of the particular bit is the same as the valid data EN, the decision unit 230 determines that the multi-bit data D0 to D6 is a valid data. Otherwise, the decision unit 230 determines that the multi-bit data D0 to D6 is an invalid data. The decision unit 230 may be formed of an XOR gate receiving the valid data EN and the data D6 of the particular bit. An output signal EN_N of the decision unit 230 becomes a signal representing the validity of the data D0 to D6. While FIG. 2 shows the decision unit 230 comparing the valid data EN and the data D6 of the particular bit as an example, the decision unit 230 may decide the validity of the data D0 to D6 by comparing data of any other bit, e.g., D2 or D5, among the data D0 to D6 with the valid data EN.

The latch unit 240 stores the multi-bit data D0 to D6 and the validity EN_N as determined by the decision unit 230. The information stored in the latch unit 240 becomes the information used by a system including the data storing circuit. Since the system including the data storing circuit may directly use the output signal EN_N of the decision unit 230 and the data D0 to D6 stored in the storage unit 210, the latch unit 240 is not an essential constituent element.

The following Table 2 shows how information that is erroneously stored in the storage unit 210 is determined to be invalid.

TABLE 2

|  | EN_N | EN | D6 | D5 | D4 | D3 | D2 | D1 | D0 |
|---|---|---|---|---|---|---|---|---|---|
| Programmed Data | 1 | 1 | 0 | 1 | 1 | 0 | 1 | 1 | 0 |
| Invalidation | 1→0 | 1 | 0→1 | 1 | 1 | 0 | 1 | 1 | 0 |

Referring to Table 2, a data D0 to D6 of '0110110' is initially programmed and the programmed data is marked to be valid. To determine that the data D0 to D6 is invalid, the logic value of the valid data EN is to be changed or the logic value of the data D6 of the particular bit is to be changed. However, since the logic value of the valid data EN cannot be changed, which means it is difficult to change '1' to '0', the logic value of the data D6 is changed from '0' to '1'. In this way, the information stored in the data storing circuit is invalidated.

Table 3 shows another example of invalidating information stored in the storage unit 210.

TABLE 3

|  | EN_N | EN | D6 | D5 | D4 | D3 | D2 | D1 | D0 |
|---|---|---|---|---|---|---|---|---|---|
| Programmed Data | 1 | 0 | 1 | 1 | 0 | 1 | 0 | 1 | 1 |
| Invalid Data Determination | 1→0 | 0→1 | 1 | 1 | 0 | 1 | 0 | 1 | 1 |

Figure 3:
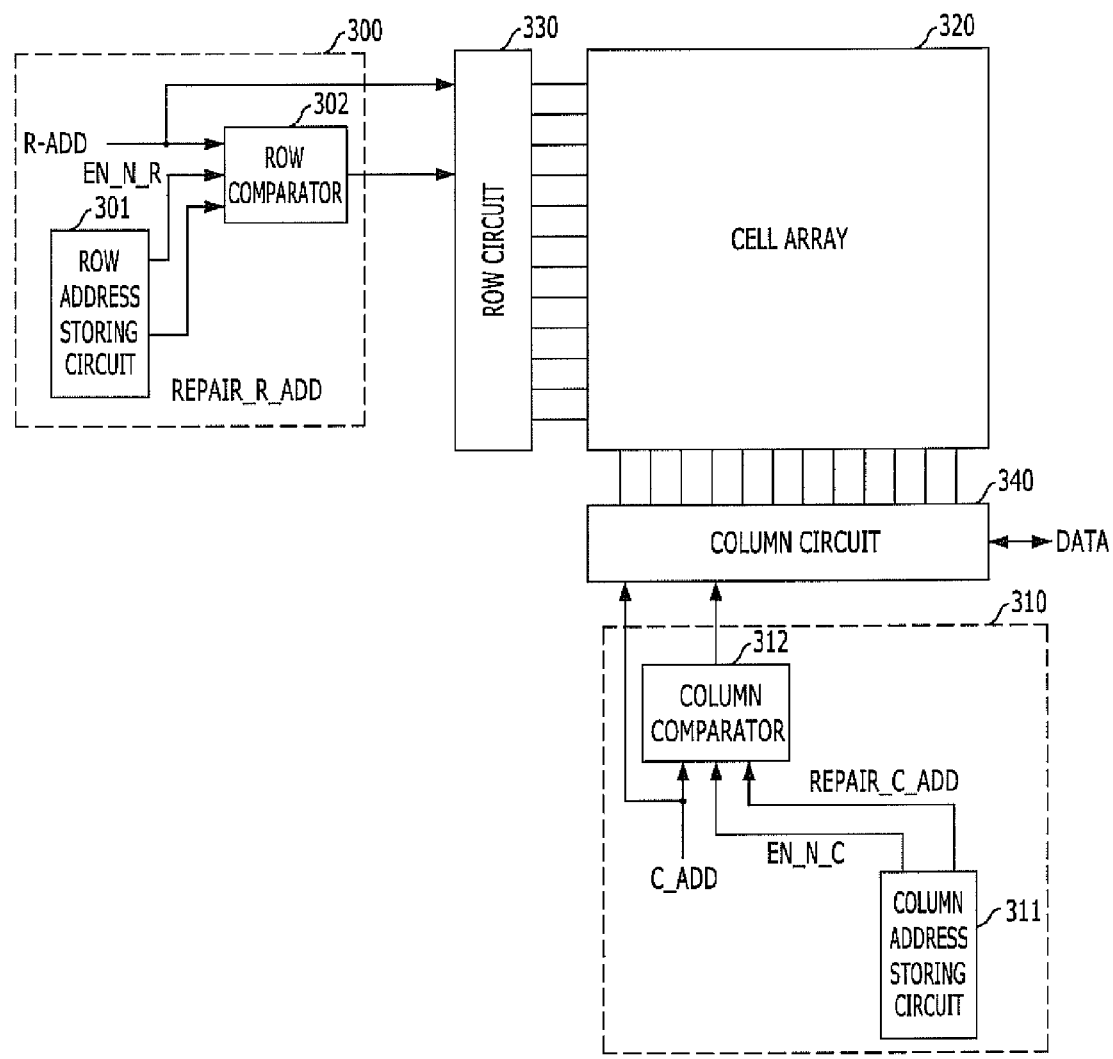
FIG. 3 is a block view illustrating a memory device including the data storing circuit shown in FIG. 2.

Referring to FIG. 3, the data D0 to D6 of '1101011' is initially programmed, and the programmed data is marked to be valid. To determine the programmed data D0 to D6 to be invalid, the logic value of the valid data EN is to be changed or the logic value of the data D6 of the particular bit is to be changed. However, since the logic value of the data D6 is not changed ('1' is not changed to '0' after being programmed to "1"), the logic value of the valid data EN is changed from '1' to '0' instead. In this way, the information stored in the data storing circuit is determined to be invalid.

According to the embodiment of the present invention, the validity of the data D0 to D6 is determined by comparing the valid data EN with the data D6 of the particular bit. Therefore, validity of the programmed data stored in the data storing circuit may be determined without requiring an additional storage.

FIG. 3 is a block view illustrating a memory device including the data storing circuit shown in FIG. 2.

Referring to FIG. 3, the memory device includes a row repair circuit 300, a column repair circuit 310, a cell array 320 including a plurality of memory cells, a row circuit 330 for enabling a word line selected based on a row address R_ADD, and a column circuit 340 for accessing a data of a bit line selected based on a column address C_ADD.

The row repair circuit 300 includes a row address storing circuit 301 and a row comparator 302. The row address storing circuit 301 stores a multi-bit row address of a defective memory cell in the cell array 320 as a repair row address REPAIR_R_ADD. A valid signal EN_N_R outputted from the row address storing circuit 301 represents that the repair row address REPAIR_R_ADD stored in the row address storing circuit 301 is valid. The row address storing circuit 301 may be formed to be the same as the data storing circuit of FIG. 2.

When the valid signal EN_N_R is enabled, the row comparator 302 compares the row address R_ADD inputted from the outside of the memory device with the repair row address REPAIR_R_ADD stored in the row address storing circuit 301. If the repair row address REPAIR_R_ADD is the same as the row address R_ADD, the row comparator 302 controls the row circuit 330 to enable a redundancy word line instead of a word line designated by the row address R_ADD. When the valid signal EN_N_R is disabled, the repair row address REPAIR_R_ADD is not valid. Therefore, the row comparator 302 is disabled and thus, the comparison operation and the repair operation are not performed.

The column repair circuit 310 includes a column address storing circuit 311 and a column comparator 312. The column address storing circuit 311 stores a multi-bit column address that corresponds to a failure memory cell in the cell array 320 as a repair column address REPAIR_C_ADD. A valid signal EN_N_C outputted from the column address storing circuit 311 represents that the repair column address REPAIR_C_ADD stored in the column address storing circuit 311 is valid. The column address storing circuit 311 may be formed to be the same as the data storing circuit of FIG. 2.

When the valid signal EN_N_C is enabled, the column comparator 312 compares the column address C_ADD inputted from the outside of the memory device with the repair column address REPAIR_C_ADD stored in the column address storing circuit 311. If the repair column address REPAIR_C_ADD is the same as the column address C_ADD, the column comparator 312 controls the column circuit 340 to access a redundancy bit line instead of a word line designated by the column address C_ADD. When the valid signal EN_N_C is disabled, the repair column address REPAIR_C_ADD is not valid. Therefore, the column comparator 312 is disabled, and thus, the comparison operation and the repair operation are not performed.

When the data storing circuit of the present invention is applied to a circuit 301 and 311 for storing an address of a defective memory cell, the repair row addresses REPAIR_R_ADD and REPAIR_C_ADD that are erroneously stored may be determined to be invalid.

Figure 4:
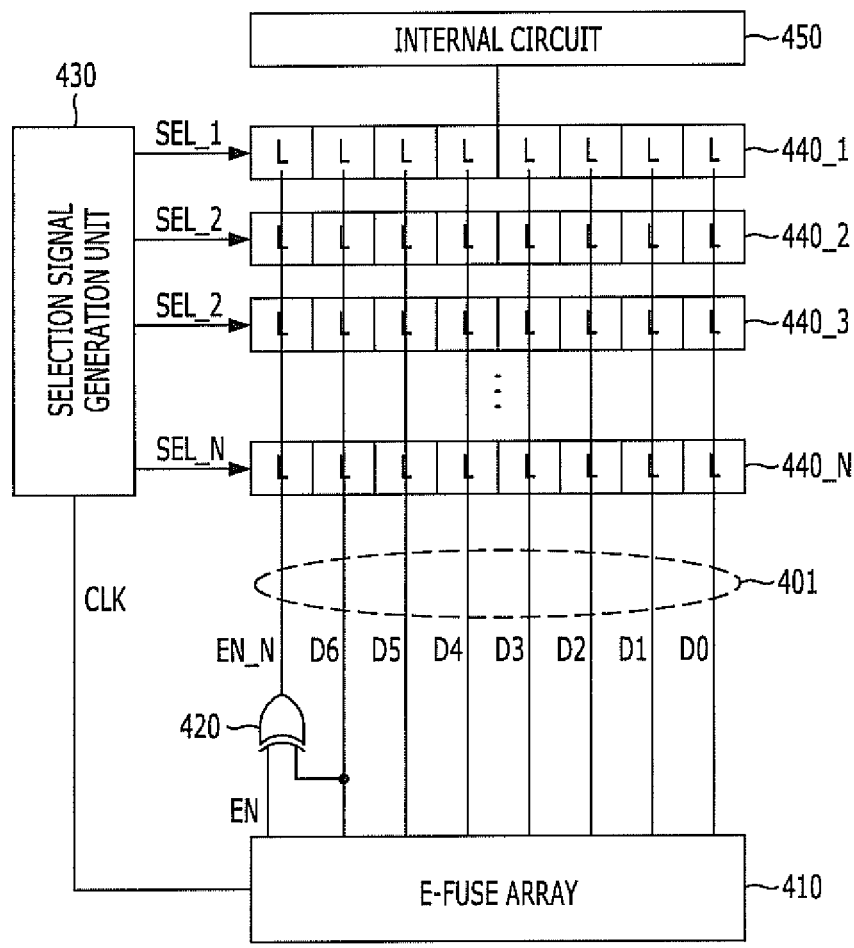
FIG. 4 is a block view illustrating an integrated circuit chip in accordance with an embodiment of the present invention.

FIG. 4 is a block view illustrating an integrated circuit chip in accordance with an embodiment of the present invention.

FIG. 4 shows a case where the storage unit 210 is formed of an e-fuse array 410 in the data storing circuit and applied to an integrated circuit chip. Referring to FIG. 4, the integrated circuit chip includes an e-fuse array 410, a decision unit 420, a selection signal generation unit 430, and a plurality of latch sets 440_1 to 440_N.

The e-fuse array 410 stores a plurality of data sets, each of which is formed of a multi-bit data, and a valid signal corresponding to each data set. The e-fuse array 410 is any reasonably e-fuse array circuit with reduced circuit area by forming a plurality of e-fuses in the form of an array (for example, e-fuses disclosed in U.S. Pat. Nos. 6,904,751, 6,777,757, 6,667,902, 7,173,851, and 7,269,047). One data set and a valid signal corresponding to the data set are outputted from the e-fuse array 410 in synchronization with a clock CLK for each cycle of the clock CLK.

The following Table 4 shows information outputted from the e-fuse array 410 for each clock.

TABLE 4

|  |  |  |  |  |  |  |  |  |
|---|---|---|---|---|---|---|---|---|
| $1^{st}$ CLK | EN_1 | D6_1 | D5_1 | D4_1 | D3_1 | D2_1 | D1_1 | D0_1 |
| $2^{nd}$ CLK | EN_2 | D6_2 | D5_2 | D4_2 | D3_2 | D2_2 | D1_2 | D0_2 |
| $3^{rd}$ CLK | EN_3 | D6_3 | D5_3 | D4_3 | D3_3 | D2_3 | D1_3 | D0_3 |
| $4^{th}$ CLK | EN_4 | D6_4 | D5_4 | D4_4 | D3_4 | D2_4 | D1_4 | D0_4 |
| $5^{th}$ CLK | EN_5 | D6_5 | D5_5 | D4_5 | D3_5 | D2_5 | D1_5 | D0_5 |
| ... | ... | ... | ... | ... | ... | ... | ... | ... |
| $N^{th}$ CLK | EN_N | D6_N | D5_N | D4_N | D3_N | D2_N | D1_N | D0_N |

The decision unit 420 compares the valid signal EN outputted from the e-fuse array 410 with a data D6 of the sixth bit that is simultaneously outputted and generates a valid decision signal EN_N. For example, the decision unit 420 generates a valid decision signal EN_N_3 by comparing a valid signal EN_3 with a data D6_3 that is simultaneously outputted.

The selection signal generation unit 430 generates a plurality of selection signals SEL_1 to SEL_N based on the clock CLK. More specifically, the selection signal generation unit 430 sequentially enables one selection signal among the selection signals SEL_1 to SEL_N whenever the clock CLK is enabled. For example, when the clock CLK is enabled for the first time, a selection signal SEL<1> is enabled, and when the clock CLK is enabled for the second time, a selection signal SEL<2> is enabled.

Each of the latch sets 440_1 to 440_N is enabled in response to a selection signal SEL_1 to SEL_N corresponding thereto, and an enabled latch set stores a data set and a validity determination signal that are transferred through a bus 401. For example, when a selection signal SEL<3> is enabled, a latch set 440_3 receives and stores information transferred through the bus 401, and when a selection signal SEL<N> is enabled, a latch set 440_N receives and stores information transferred through the bus 401. The following Table 5 shows informations that are respectively stored in the latch sets 440_1 to 440_N.

TABLE 5

|  |  |  |  |  |  |  |  |  |
|---|---|---|---|---|---|---|---|---|
| 440_1 | EN_N_1 = (EN_1 XOR D6_1) | D6_1 | D5_1 | D4_1 | D3_1 | D2_1 | D1_1 | D0_1 |
| 440_2 | EN_N_2 = (EN_2 XOR D6_2) | D6_2 | D5_2 | D4_2 | D3_2 | D2_2 | D1_2 | D0_2 |
| 440_3 | EN_N_3 = (EN_3 XOR D6_3) | D6_3 | D5_3 | D4_3 | D3_3 | D2_3 | D1_3 | D0_3 |
| 440_4 | EN_N_4 = (EN_4 XOR D6_4) | D6_4 | D5_4 | D4_4 | D3_4 | D2_4 | D1_4 | D0_4 |
| 440_5 | EN_N_5 = (EN_5 XOR D6_5) | D6_5 | D5_5 | D4_5 | D3_5 | D2_5 | D1_5 | D0_5 |
| ... | ... | ... | ... | ... | ... | ... | ... | ... |
| 440_N | EN_N_N = (EN_N XOR D6_N) | D6_N | D5_N | D4_N | D3_N | D2_N | D1_N | D0_N |

An internal circuit 450 is a circuit that uses data stored in the latch sets 440_1 to 440_N in the integrated circuit chip. For example, the internal circuit 450 may be a circuit that performs a setup operation based on the data stored in the latch sets 440_1 to 440_N or a circuit that performs a repair operation based on the data stored in the latch sets 440_1 to 440_N. The internal circuit 450 uses data stored in a latch set that stores an enabled valid determination signal (EN_N) among the latch sets 440_1 to 440_N.

Figure 5:
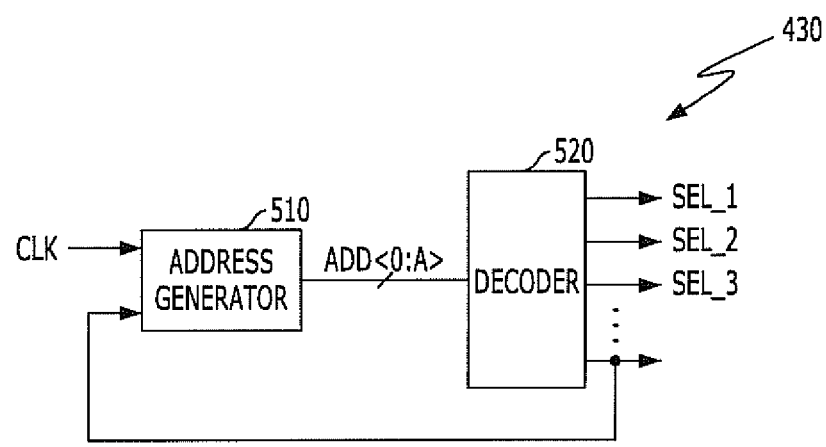
FIG. 5 is a block view illustrating a selection signal generator 430 shown in FIG. 4.

FIG. 5 is a block view illustrating the selection signal generation unit 430 shown in FIG. 4.

Referring to FIG. 5, the selection signal generation unit 430 includes an address generator 510 and a decoder 520.

The address generator 510 generates an address ADD<0:A>, which is a binary code, by counting the clock CLK. The address generator 510 may include a counter.

The decoder 520 generates a selection signal SEL_1 to SEL_N by decoding the address ADD<0:A>. The decoder 520 enables one selection signal at each time. For example, when the address ADD<0:A> is '0 . . . 01', a selection signal SEL<1> is enabled. When the address ADD<0:A> is '0 . . . 10', a selection signal SEL<2> is enabled.

After the last selection signal SEL<N> is enabled, the decoder 520 does not have to enable any more selection signal because data are already stored in latch sets 440_1 to 440_N. Therefore, after the last selection signal SEL<N> is enabled, the address generator 510 and the decoder 520 are disabled in response to the enabling of the last selection signal SEL<N> and the selection signals SEL_1 to SEL_N are kept in a disabled state.

According to an embodiment of the present invention, validity of a data stored in storage is determined by comparing a valid data with a data of a particular bit. Therefore, the data stored in the storage may be invalidated without an additional storage.

While the present invention has been described with respect to the specific embodiments, it will be apparent to those skilled in the art that various changes and modifications may be made without departing from the spirit and scope of the invention as defined in the following claims.

What is claimed is:

1. A data storing circuit, comprising:
a storage unit configured to store a multi-bit data and a validity signal representing validity of the data; and
a decision unit configured to determine validity of the multi-bit data by comparing one-bit data of the multi-bit data with the validity signal.

2. The data storing circuit of claim 1, wherein the decision unit is configured to determine the validity of the multi-bit data based on whether or not a logic value of the one-bit data is the same as a logic value of the validity signal.

3. The data storing circuit of claim 1, wherein the decision unit is configured to determine that the multi-bit data is valid when a logic value of the one-bit data is different from a logic value of the validity signal, and
the decision unit is configured to determine that the multi-bit data is invalid when the logic value of the one-bit data is the same as the logic value of the validity signal.

4. The data storing circuit of claim 1, further comprising:
a latch unit configured to store the validity of the multi-bit data as determined by the decision unit.

5. The data storing circuit of claim 4, wherein the latch unit is further configured to store the multi-bit data.

6. The data storing circuit of claim 1, wherein the storage unit includes program cells capable of changing a logic value of stored data only once.

7. A repair circuit of a memory device, comprising:
a storage unit configured to store a multi-bit repair address and a validity signal representing validity of the repair address;
a decision unit configured to determine validity of the repair address by comparing one-bit data of the multi-bit repair address with the validity signal and generate a validity determination signal in response to the comparison;
a latch unit configured to store the validity determination signal and the repair address; and
an address comparison unit configured to generate, when the validity determination signal is enabled, a repair signal by comparing an input address and the repair address stored in the latch unit.

8. The repair circuit of claim 7, wherein the repair circuit is a row repair circuit and when the repair signal is enabled, the memory device is configured to access a redundancy row, and
when the repair signal is disabled, the memory device is configured to access a row designated by the input address.

9. The repair circuit of claim 7, wherein the repair circuit is a column repair circuit, and when the repair signal is enabled, the memory device is configured to access a redundancy column, and
when the repair signal is disabled, the memory device is configured to access a column designated by the input address.

10. An integrated circuit chip, comprising:
an e-fuse array configured to store a plurality of data sets, each of which includes a multi-bit data, and validity signals that correspond to the data sets, respectively, and output a data set of the data sets and the corresponding validity signal at each cycle of a clock;
a decision unit configured to generate validity determination signals, wherein the validity determination signals are each generated by comparing a respective one of the validity signals with one-bit data of the data set corresponding to the validity signal;
a bus configured to transfer the validity determination signals and the data sets corresponding to the validity determination signals;
a selection signal generation unit configured to generate a plurality of selection signals in response to the clock; and
a plurality of latch sets configured to each store, in response to an enabled one of the selection signals, one of the validity determination signals and the data set corresponding to the validity determination signal.

11. The integrated circuit chip of claim 10, wherein the selection signal generation unit is configured to enable different ones of the multiple selection signals in different periods, respectively, of the clock.

12. The integrated circuit chip of claim 10, wherein the determination unit is configured to generate each of the validity determination signals based on whether or not a logic value of the one-bit data of the corresponding data set is the same as a logic value of the respective one of the validity signals.

13. The integrated circuit chip of claim 10, wherein the e-fuse array is configured to output the data sets in synchronization with the clock.

* * * * *